(12) United States Patent
Kwon et al.

(10) Patent No.: US 11,302,396 B2
(45) Date of Patent: *Apr. 12, 2022

(54) MEMORY DEVICE

(71) Applicant: Samsung Electronics Co., Ltd., Suwon-si (KR)

(72) Inventors: Taehong Kwon, Seoul (KR); Youngsun Min, Hwaseong-si (KR); Daeseok Byeon, Seongnam-si (KR); Kyunghwa Yun, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/862,167

(22) Filed: Apr. 29, 2020

(65) Prior Publication Data
US 2021/0065801 A1    Mar. 4, 2021

(30) Foreign Application Priority Data
Sep. 4, 2019 (KR) .................. 10-2019-0109530

(51) Int. Cl.
| | |
|---|---|
| *G11C 8/00* | (2006.01) |
| *G11C 16/04* | (2006.01) |
| *G11C 16/08* | (2006.01) |
| *G11C 16/26* | (2006.01) |
| *G11C 16/30* | (2006.01) |
| *G11C 16/24* | (2006.01) |
| *G11C 16/10* | (2006.01) |
| *H01L 27/1157* | (2017.01) |

(52) U.S. Cl.
CPC .......... *G11C 16/0483* (2013.01); *G11C 16/08* (2013.01); *G11C 16/10* (2013.01); *G11C 16/24* (2013.01); *G11C 16/26* (2013.01); *G11C 16/30* (2013.01); *H01L 27/1157* (2013.01)

(58) Field of Classification Search
CPC .... G11C 8/10; G11C 8/08; G11C 8/12; G11C 8/14
USPC ............................................. 365/230.06, 63
See application file for complete search history.

(56) References Cited

U.S. PATENT DOCUMENTS

| | | |
|---|---|---|
| 9,558,945 B2 | 1/2017 | Fukuzumi et al. |
| 9,564,229 B2 | 2/2017 | Choi et al. |
| | (Continued) | |

OTHER PUBLICATIONS

U.S. Office Action dated Oct. 6, 2021 issued in related U.S. Appl. No. 16/944,711.

(Continued)

*Primary Examiner* — Son T Dinh
(74) *Attorney, Agent, or Firm* — Harness, Dickey & Pierce, P.L.C.

(57) ABSTRACT

A memory device includes a memory cell array, a row decoder connected to the memory cell array by a plurality of string selection lines, a plurality of word lines, and a plurality of ground selection lines, and a common source line driver connected to the memory cell array by a common source line. The memory cell array is located in an upper chip, at least a portion of the row decoder is located in a lower chip, at least a portion of the common source line driver is located in the upper chip, and a plurality of upper bonding pads of the upper chip are connected to a plurality of lower bonding pads of the lower chip to connect the upper chip to the lower chip.

20 Claims, 10 Drawing Sheets

(56) References Cited

U.S. PATENT DOCUMENTS

| | | | |
|---|---|---|---|
| 9,576,969 B2 * | 2/2017 | Manorotkul | H01L 21/02592 |
| 10,141,326 B1 | 11/2018 | Oh et al. | |
| 10,157,951 B2 * | 12/2018 | Kim | H04N 5/3532 |
| 10,319,730 B2 | 6/2019 | Matsuo | |
| 2013/0122653 A1 | 5/2013 | Lee et al. | |
| 2018/0261575 A1 | 9/2018 | Tagami et al. | |
| 2018/0277477 A1 | 9/2018 | Ishihara | |
| 2018/0277497 A1 | 9/2018 | Matsuo | |
| 2019/0081017 A1 | 3/2019 | Nakajima | |
| 2019/0081069 A1 | 3/2019 | Lu et al. | |
| 2019/0088676 A1 | 3/2019 | Tagami et al. | |
| 2019/0221557 A1 | 7/2019 | Kim et al. | |
| 2021/0066281 A1 * | 3/2021 | Kwon | G11C 16/26 |

OTHER PUBLICATIONS

German Office Action dated Dec. 17, 2021, issued in corresponding German Patent Application No. 10 2020 110 435.9.

* cited by examiner

MEMORY DEVICE

CROSS-REFERENCE TO RELATED APPLICATION

This application claims the benefit of Korean Patent Application No. 10-2019-0109530, filed on Sep. 4, 2019, in the Korean Intellectual Property Office, the disclosure of which is incorporated herein in its entirety by reference.

BACKGROUND

The inventive concepts relate to a memory device. For example, the inventive concepts relate to a memory device including two stacked chips.

The miniaturization of electronic devices, the reduction of manufacturing costs of memory devices, and/or the demand for higher-capacity memory devices may require an improvement in the integration density of the memory devices. A memory device including two stacked chips has been developed to improve the integration density of the memory devices.

SUMMARY

The inventive concepts provide a memory device, which may reduce the occurrence of noise due to a voltage drop caused by a resistance.

According to an aspect of the inventive concepts, there is provided a memory device including a memory cell array, a row decoder connected to the memory cell array by a plurality of string selection lines, a plurality of word lines, and a plurality of ground selection lines, and a common source line driver connected to the memory cell array by a common source line. The memory cell array is in an upper chip. At least a portion of the row decoder is in a lower chip. At least a portion of the common source line driver is in the upper chip. A plurality of upper bonding pads of the upper chip are connected to a plurality of lower bonding pads of the lower chip to connect the upper chip to the lower chip.

According to another aspect of the inventive concepts, there is provided a memory device including a lower chip and an upper chip. The upper chip includes a common source line, a memory cell array on the common source line, a read common source line transistor on the common source line, a ground pad connected to the read common source line transistor, and a plurality of upper bonding pads connected to the memory cell array. The lower chip includes a substrate, a lower circuit on the substrate, and a plurality of lower bonding pads connected to the lower circuit. The upper chip is in contact with the lower chip such that the plurality of upper bonding pads of the upper chip are in contact with the plurality of lower bonding pads of the lower chip.

According to another aspect of the inventive concepts, there is provided a memory device including a common source line in an upper portion of an upper chip, a memory cell array including a plurality of gate layers and a plurality of channel structures, the plurality of gate layers stacked on a lower surface of the common source line and spaced apart from each other, the plurality of channel structures passing through the plurality of gate layers and in contact with the common source line, a read common source line transistor including a gate layer and a channel structure, the gate layer on the lower surface of the common source line, the channel structure passing through the gate layer and in contact with the common source line, a ground pad connected to the channel structure of the read common source line transistor and in the upper portion of the upper chip, a plurality of upper bonding pads connected to the memory cell array and in a lower portion of the upper chip, a substrate in a lower portion of a lower chip, a lower circuit on an upper surface of the substrate, and a plurality of lower bonding pads connected to the lower circuit and in an upper portion of the lower chip, the plurality of lower bonding pads in contact with the plurality of upper bonding pads of the upper chip.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

When the words "about" and "substantially" are used in this application in connection with a numerical value, it is intended that the associated numerical value include a tolerance of ±10% around the stated numerical value, unless otherwise explicitly defined.

Two elements are referred to have "substantially the same composition" when two elements are fabricated simultaneously by the same fabrication step but difference between compositions of two elements may exist because of any non-uniformity or inhomogeneity originating from limitation of the fabrication method or fabrication equipment.

Figure 1:
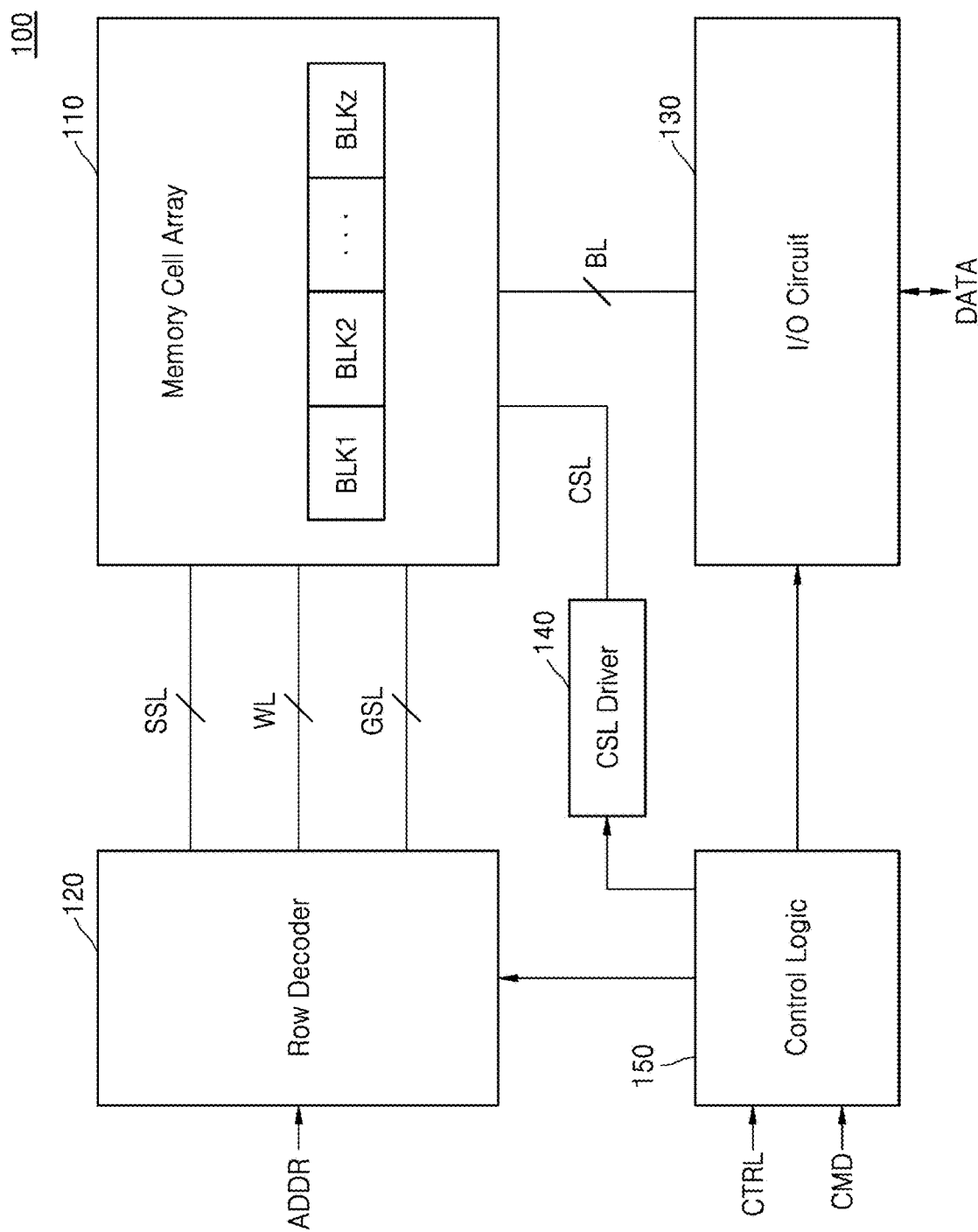
FIG. 1 is a block diagram of a memory device according to an embodiment.

FIG. 1 is a block diagram of a memory device 100 according to an embodiment.

Referring to FIG. 1, the memory device 100 may include a memory cell array 110, a row decoder 120, an input/output (I/O) circuit 130, a common source line driver (or CSL driver) 140, and/or a control logic 150.

The memory cell array 110 may include a plurality of blocks BLK1 to BLKz. Each of the blocks BLK1 to BLKz may include a plurality of memory cells capable of storing data. The memory cell array 110 may include at least one of a single-level cell block including single-level cells (SLCs), a multi-level cell block including multi-level cells (MLCs), a triple-level cell block including triple-level cells (TLCs), and a quad-level cell block including quad-level cells (QLCs). For example, some of the plurality of blocks BLK1 to BLKz may be single-level cell blocks, and the others thereof may be multi-level cell blocks, triple-level cell blocks, or quad-level cell blocks.

The plurality of memory cells included in the memory cell array 110 may be non-volatile memory cells configured to retain stored data even if power supply is interrupted. For example, the memory cell array 110 may include electrically erasable and programmable ROM (EEPROM), flash memory, phase-change random access memory (PRAM), resistive RAM (RRAM), magnetic RAM (MRAM), or ferroelectric RAM (FRAM). Hereinafter, embodiments will be described on the assumption that the plurality of memory cells are NAND flash memory cells.

The row decoder 120 may be connected to the memory cell array 110 by a plurality of string selection lines SSL, a plurality of word lines WL, and/or a plurality of ground selection lines GSL. The row decoder 120 may select at least one of the plurality of blocks BLK1 to BLKz of the memory cell array 110 in response to an address ADDR provided by a memory controller (not shown). The row decoder 120 may select at least one of the word lines WL, the string selection lines SSL, and the ground selection lines GSL of the selected block in response to the address ADDR provided by the memory controller.

The I/O circuit 130 may be connected to the memory cell array 110 through a plurality of bit lines BL. The I/O circuit 130 may select at least one of the bit lines BL. The I/O circuit 130 may store data received by the memory controller in the memory cell array 110. Also, the I/O circuit 130 may output data read from the memory cell array 110 to the memory controller. The I/O circuit 130 may operate as a write driver or a sense amplifier. For example, during a program operation, the I/O circuit 130 may operate as the write driver and apply a voltage corresponding to data DATA to be stored in the memory cell array 110 to the bit lines BL. During a read operation, the I/O circuit 130 may operate as the sense amplifier and sense data DATA stored in the memory cell array 110.

The CSL driver 140 may be connected to the memory cell array 110 through a common source line CSL. The CSL driver 140 may ground the common source line CSL or apply a voltage to the common source line CSL.

The control logic 150 may control the overall operation of the memory device 100. For example, the control logic 150 may control operations of the row decoder 120, the CSL driver 140, and the I/O circuit 130. For instance, the control logic 150 may control the memory device 100 to perform a memory operation corresponding to a command CMD provided by the memory controller (not shown). Also, the control logic 150 may generate various internal control signals used in the memory device 100, in response to a control signal CTRL provided by the memory controller.

Figure 2:
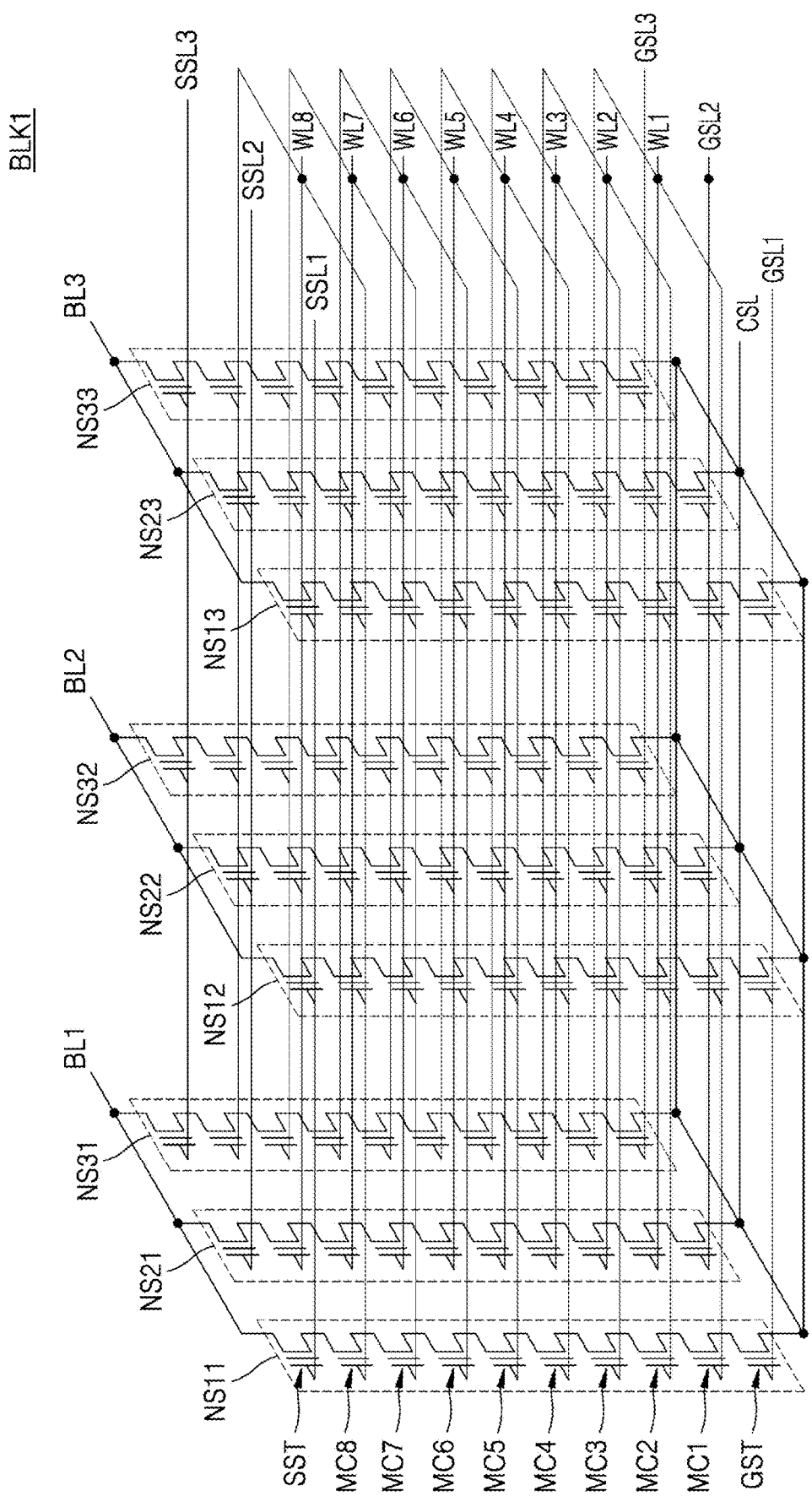
FIG. 2 is a circuit diagram of a block of a memory cell array of a memory device according to an embodiment.

FIG. 2 is a circuit diagram of a block BLK1 of a memory cell array (refer to 110 in FIG. 1) of a memory device (refer to 100 in FIG. 1) according to an embodiment.

Referring to FIG. 2, the block BLK1 may include a plurality of NAND strings (e.g., NS11 to NS33). Although FIG. 2 illustrates a case in which one block BLK1 includes nine NAND strings NS11 to NS33, the number of NAND strings included in one block is not limited thereto. Each of the NAND strings NS11 to NS33 may include at least one string selection transistor SST, a plurality of memory cells (e.g., MC1 to MC8), and/or at least one ground selection transistor GST, which are connected in series. Although FIG. 2 illustrates a case in which each of the NAND strings NS11 to NS33 includes one string selection transistor SST, eight memory cells MC1 to MC8, and one ground selection transistor GST, the numbers of string selection transistors, memory cells, and ground selection transistors included in one NAND string are not limited thereto.

The NAND strings NS11 to NS33 may be connected between first to third bit lines BL1 to BL3 and a common source line CSL. Gates of the string selection transistors SST may be connected to first to third string selection lines SSL1 to SSL3, gates of the memory cells MC1 to MC8 may be connected to word lines WL1 to WL8, and gates of the ground selection transistors GST may be connected to first to third ground selection lines GSL1 to GSL3. The common source line CSL may be connected in common to the NAND strings NS11 to NS33. Also, the word lines WL1 to WL8 may be connected in common to the NAND strings NS11 to NS33.

NAND strings connected in common to one bit line may constitute one column. For example, the NAND strings NS11, NS21, and NS31 connected in common to the first bit line BL1 may correspond to a first column, the NAND strings NS12, NS22, and NS32 connected in common to the second bit line BL2 may correspond to a second column, and the NAND strings NS13, NS23, and NS33 connected in common to the third bit line BL3 may correspond to the third column.

NAND strings connected to one string selection line may constitute one row. For example, the NAND strings NS11, NS12, and NS13 connected to the first string selection line SSL1 may correspond to a first row, the NAND strings NS21, NS22, and NS23 connected to the second string selection line SSL2 may correspond to a second row, and NAND strings NS31, NS32, and NS33 connected to the third string selection line SSL3 may correspond to a third row.

Figure 3:
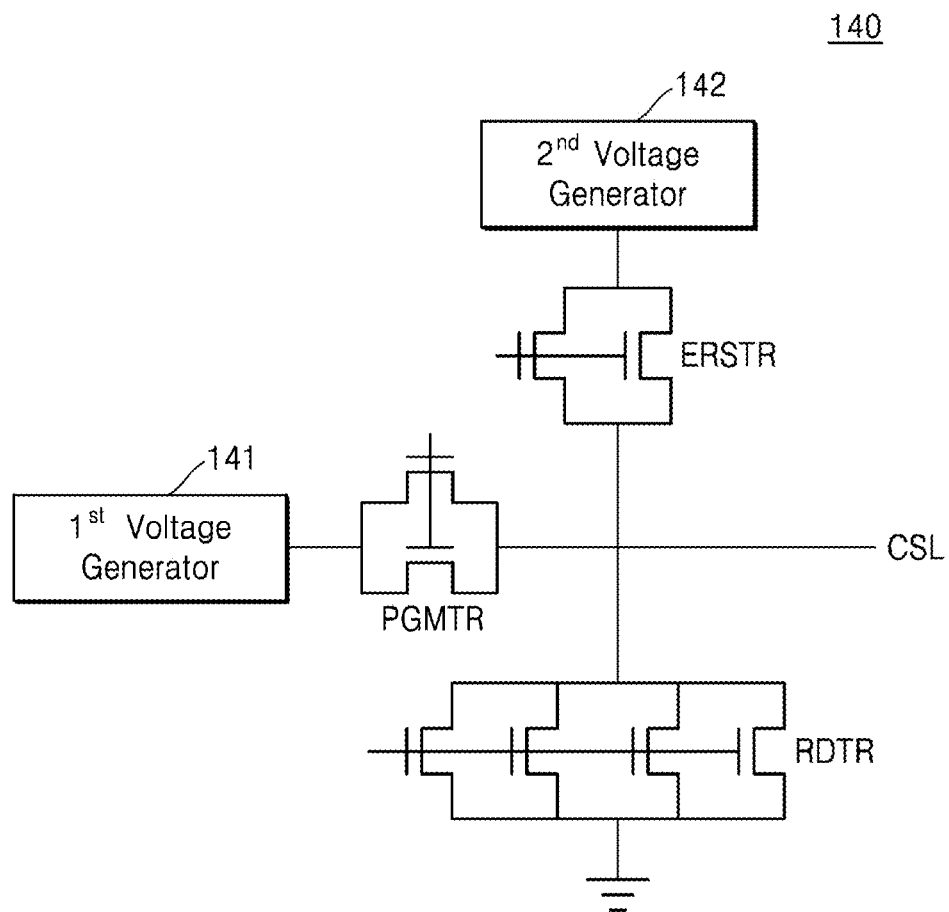
FIG. 3 is a circuit diagram of a common source line driver of a memory device according to an embodiment.

FIG. 3 is a circuit diagram of a CSL driver 140 of a memory device (refer to 100 in FIG. 1) according to an embodiment.

Referring to FIG. 3, the CSL driver 140 may include a plurality of read common source line transistors RDTR, a plurality of program common source line transistors PGMTR, a plurality of erase common source line transistors ERSTR, a first voltage generator 141, and/or a second voltage generator 142.

Each of the read common source line transistors RDTR may be used during a read operation. Each of the read common source line transistors RDTR may selectively ground a common source line CSL. That is, each of the read common source line transistors RDTR may be connected between a ground pad and the common source line CSL. A gate of each of the read common source line transistors RDTR may be controlled by a control logic (refer to 150 in FIG. 1). The plurality of read common source line transistors RDTR may be connected in parallel.

Each of the program common source line transistors PGMTR may be used during a program operation. Each of the program common source line transistors PGMTR may selectively apply a voltage to the common source line CSL. That is, each of the program common source line transistors PGMTR may be connected between the first voltage generator 141 and the common source line CSL. A gate of each of the program common source line transistors PGMTR may be controlled by the control logic 150. The plurality of program common source line transistors PGMTR may be connected in parallel.

Each of the erase common source line transistors ERSTR may be used during an erase operation. Each of the erase common source line transistors ERSTR may selectively apply a voltage to the common source line CSL. That is, each of the erase common source line transistors ERSTR may be connected between the second voltage generator 142 and the common source line CSL. A gate of each of the erase common source line transistors ERSTR may be controlled by the control logic 150. The plurality of erase common source line transistors ERSTR may be connected in parallel.

Current flowing between the common source line CSL and the ground pad during a read operation may be larger than current flowing between the common source line CSL and the first voltage generator 141 during a program operation and current flowing between the common source line CSL and the second voltage generator 142 during an erase operation. Accordingly, the number of read common source line transistors RDTR included in the CSL driver 140 may be greater than the number of program common source line transistors PGMTR included in the CSL driver 140 and the number of erase common source line transistors ERSTR included in the CSL driver 140. For example, the number of read common source line transistors RDTR included in the CSL driver 140 may be at least about twice (e.g., at least about 10 times) the number of program common source line transistors PGMTR included in the CSL driver 140. In some embodiments, the number of program common source line transistors PGMTR included in the CSL driver 140 may be equal to the number of erase common source line transistors ERSTR included in the CSL driver 140.

Figure 4:
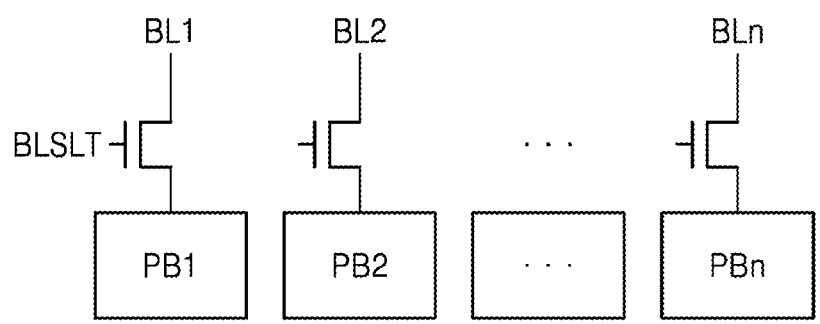
FIG. 4 is a circuit diagram of an input/output (I/O) circuit of a memory device according to an embodiment.
Figure 5:
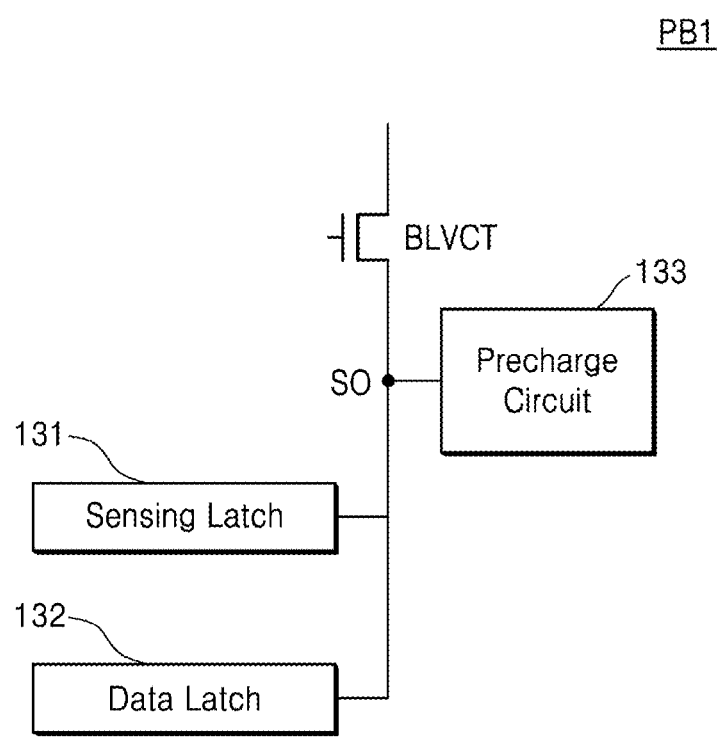
FIG. 5 is a circuit diagram of a page buffer of an I/O circuit of a memory device according to an embodiment.

FIG. 4 is a circuit diagram of an I/O circuit 130 of a memory device (refer to 100 in FIG. 1) according to an embodiment. FIG. 5 is a circuit diagram of a page buffer PB of the I/O circuit 130 of the memory device 100, according to an embodiment.

Referring to FIG. 4, the I/O circuit 130 may include a plurality of bit line selection transistors BLSLT and/or a plurality of page buffers PB1 to PBn. Each of the bit line selection transistors BLSLT may connect corresponding one of bit lines BL1 to BLn to corresponding one of the page buffers PB1 to PBn. That is, each of the bit line selection transistors BLSLT may be connected between the corresponding one of the bit lines BL1 to BLn and the corresponding one of the page buffers PB1 to PBn. A gate of each of the bit line selection transistors BLSLT may be controlled by a control logic (refer to 150 in FIG. 1). Each of the bit line selection transistors BLSLT may be a high-voltage transistor.

Referring to FIG. 5, the page buffer PB1 may include a bit line control transistor BLVCT, a precharge circuit 133, a sensing latch 131, and/or a data latch 132. The bit line control transistor BLVCT may be connected between the bit line selection transistor BLSLT and a sensing node SO. A gate of the bit line control transistor BLVCT may be controlled by the control logic 150. The bit line control transistor BLVCT may reduce or prevent a high voltage from being transmitted to the sensing node SO. The precharge circuit 133 may be connected to the sensing node SO and selectively precharge the sensing node SO. The sensing latch 131 may be connected to the sensing node SO and sense a voltage level of the sensing node SO and store data. The data latch 132 may be connected to the sensing node SO and store data. Operations of the precharge circuit 133, the sensing latch 131, and the data latch 132 may be controlled by operations of the control logic 150.

Figure 6:
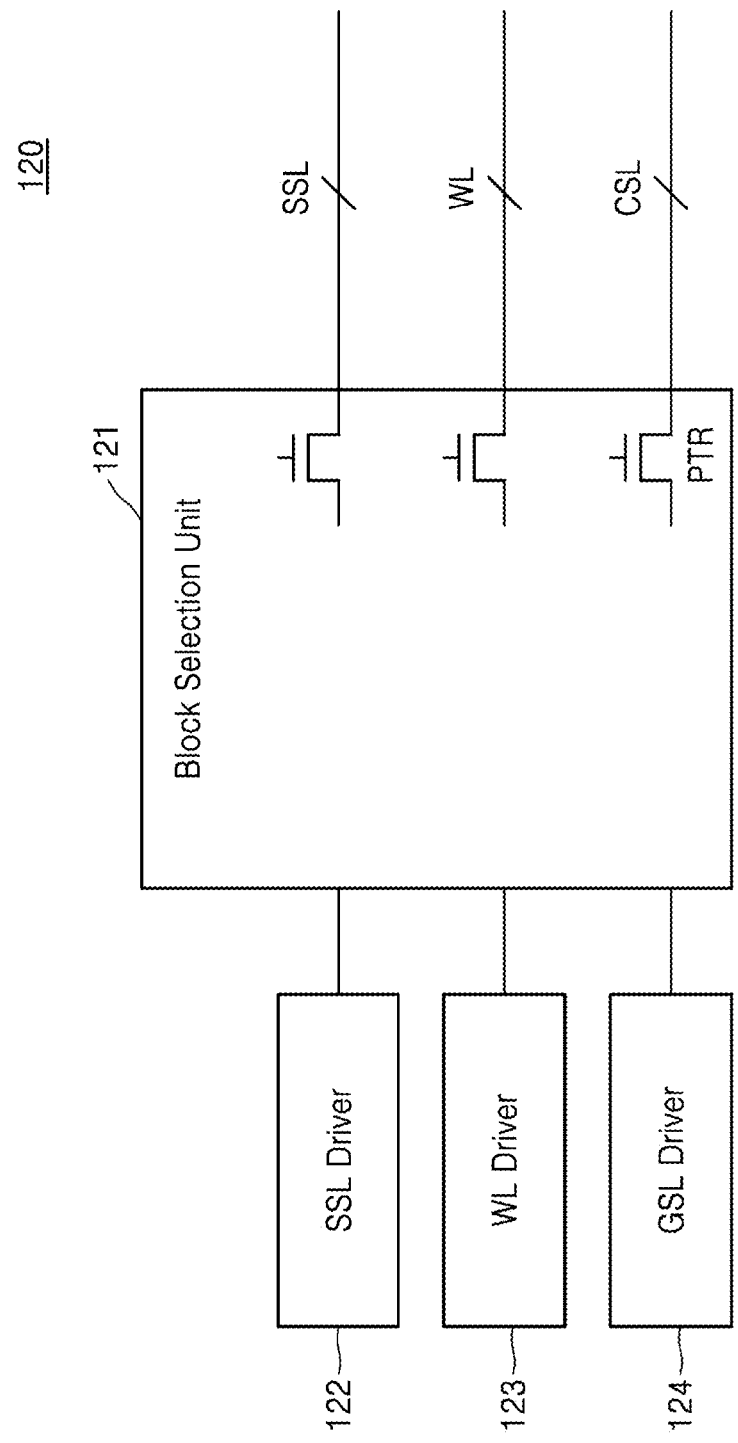
FIG. 6 is a block diagram of a row decoder of a memory device according to an embodiment.

FIG. 6 is a block diagram of a row decoder 120 of a memory device (refer to 100 in FIG. 1) according to an embodiment.

Referring to FIG. 6, the row decoder 120 may include a block selection unit 121, a string selection line driver (or SSL driver) 122, a word line driver (or WL driver) 123, and/or a ground selection line driver (or GSL driver) 124. The block selection unit 121 may be connected to a plurality of string selection lines SSL, a plurality of word lines WL, and a plurality of ground selection lines GSL. The block selection unit 121 may select at least one of blocks (refer to BLK1 to BLKz in FIG. 1) of a memory cell array (refer to 110 in FIG. 1). The block selection unit 121 may include a plurality of pass transistors PTR. Operations of the plurality of string selection lines SSL, the plurality of word lines WL, and the plurality of ground selection lines GSL may be controlled based on a switching operation of the pass transistor PTR.

The SSL driver 122 may be connected to the plurality of string selection lines SSL through the block selection unit 121 and drive the plurality of string selection lines SSL. For example, the SSL driver 122 may float the string selection lines SSL during an erase operation and provide a relatively high string selection voltage to the string selection lines SSL during a program operation.

The WL driver 123 may be connected to the plurality of word lines WL through the block selection unit 121 and drive the plurality of word lines WL. For example, during an erase operation, the WL driver 123 may provide a relatively low word line voltage to the plurality of word lines WL. In addition, during a program operation, the WL driver 123 may provide a relatively high program voltage to a selected word line WL and provide a pass voltage to an unselected word line WL.

The GSL driver 124 may be connected to the plurality of ground selection lines GSL through the block selection unit 121 and drive the plurality of ground selection lines GSL. For example, the GSL driver 124 may float the ground selection lines GSL during an erase operation and provide a relatively low ground selection voltage to the ground selection lines GSL during a program operation.

Figure 7A:
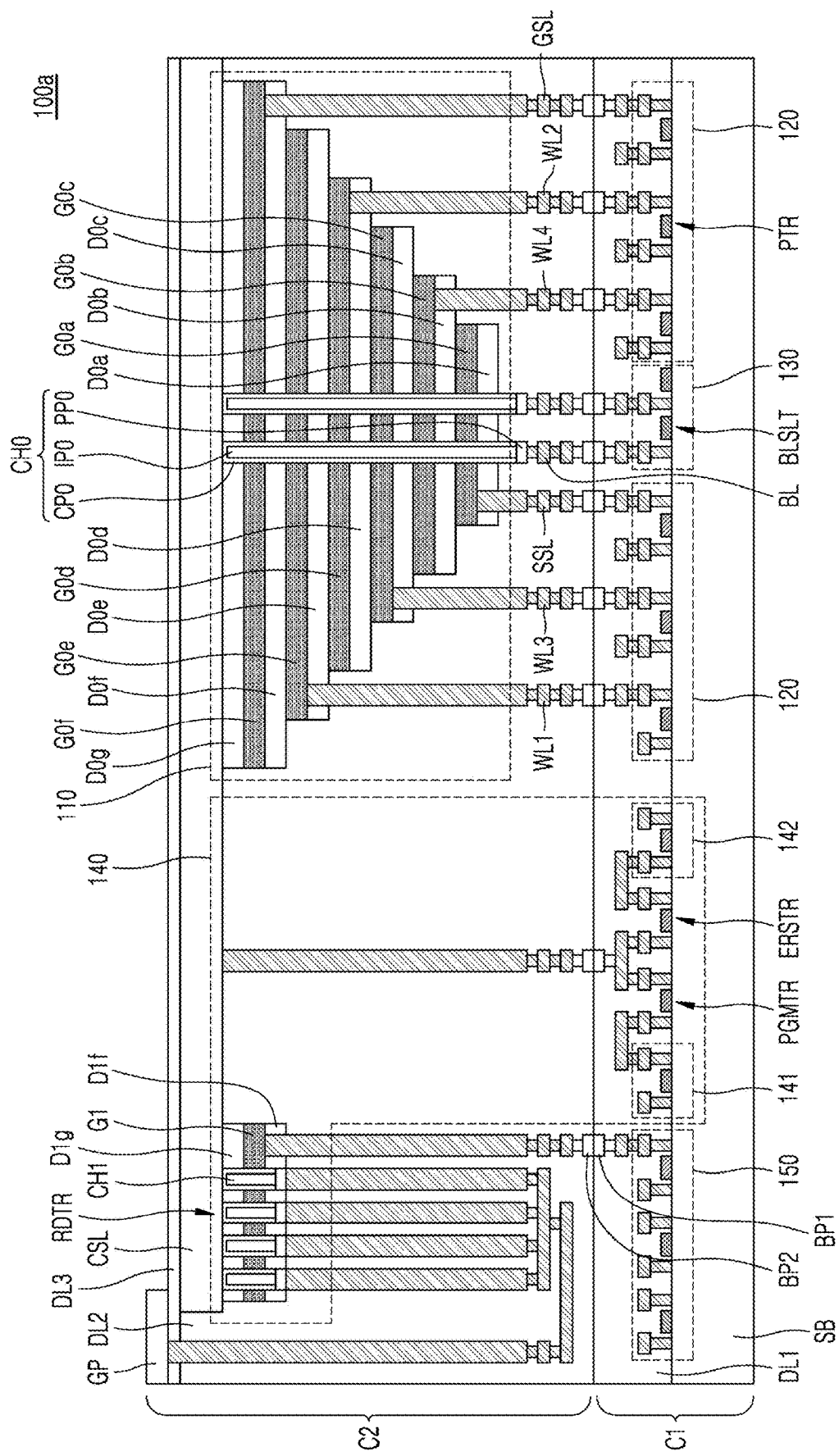
FIG. 7A is a cross-sectional view of a memory device according to an embodiment.

FIG. 7A is a cross-sectional view of a memory device 100a according to an embodiment.

Referring to FIG. 7A, the memory device 100a may include a lower chip C1 and an upper chip C2 located on the lower chip C1. An upper surface of the lower chip C1 may be in contact with a lower surface of the upper chip C2. The lower chip C1 and the upper chip C2 may be bonded to each other using a direct bonding technique. The lower chip C1 may include a substrate SB, a lower circuit, a plurality of lower bonding pads BP1, and/or a first interlayer insulating layer DL1. The upper chip C2 may include a common source line CSL, a memory cell array 110, a plurality of bit lines BL, a plurality of string selection lines SSL, a plurality of word lines WL1 to WL4, a plurality of ground selection lines GSL, a plurality of read common source line transistors RDTR, a ground pad GP, a plurality of upper bonding pads BP2, a second interlayer insulating layer DL2, and/or a third interlayer insulating layer DL3.

The plurality of lower bonding pads BP1 may be located in an upper portion of the lower chip C1 and exposed at the upper surface of the lower chip C1. The plurality of upper bonding pads BP2 may be located at a lower portion of the upper chip C2 and exposed at a lower surface of the upper chip C2. The upper chip C2 may be brought into contact with the lower chip C1 such that the plurality of upper bonding pads BP2 are in contact with the plurality of lower bonding pads BP1, respectively. That is, the upper chip C2 may be connected to the lower chip C1 such that the plurality of upper bonding pads BP2 are connected to the plurality of lower bonding pads BP1, respectively.

The plurality of lower bonding pads BP1 and the plurality of upper bonding pads BP2 may include a conductive material including, but not limited to, copper (Cu), aluminum (Al), gold (Au), silver (Ag), tungsten (W), or a combination thereof. In some embodiments, the lower bonding pad BP1 and the upper bonding pad BP2 may further include a barrier material including, but not limited to, titanium (Ti), tantalum (Ta), titanium nitride (TiN), tantalum nitride (TaN), or a combination thereof to reduce or prevent the conductive material from being diffused into the first interlayer insulating layer DL1 and the second interlayer insulating layer DL2.

The substrate SB may be located in a lower portion of the lower chip C1. The substrate SB may include a semiconductor material, such as a Group-IV semiconductor material, a Group III-V semiconductor material, or a Group II-VI semiconductor material. The Group-IV semiconductor material may include, for example, silicon (Si), germanium (Ge), or a combination thereof. The Group III-V semiconductor material may include, for example, gallium arsenic (GaAs), indium phosphide (InP), gallium phosphide (GaP), indium arsenide (InAs), indium antimonide (InSb), indium gallium arsenide (InGaAs), or a combination thereof. The Group II-VI semiconductor material may include, for example, zinc telluride (ZnTe), cadmium sulfide (CdS), or a combination thereof.

As used herein, the lower circuit refers to a set of all circuits formed in the lower chip C1. The lower circuit may include a portion of a CSL driver 140, for example, a plurality of program common source line transistors PGMTR, a first voltage generator 141 connected to the plurality of program common source line transistors PGMTR, a plurality of erase common source line transistors ERSTR, and a second voltage generator 142 connected to the plurality of erase common source line transistors ERSTR. The plurality of program common source line transistors PGMTR and the plurality of erase common source line transistors ERSTR may be connected to the common source line CSL of the upper chip C2 through the lower bonding pad BP1 and the upper bonding pad BP2.

The lower circuit may further include control logic 150. The control logic 150 may be connected to gate layers G1 of the plurality of read common source line transistors RDTR of the upper chip C2 through the lower bonding pad BP1 and the upper bonding pad BP2. The lower circuit may further include an I/O circuit 130. The lower circuit may further include a row decoder 120 including a plurality of pass transistors PTR. The plurality of pad transistors PTR of the row decoder 120 may be connected to the plurality of gate layers G0a to G0f of the memory cell array 110 through the plurality of lower bonding pads BP1 and the plurality of upper bonding pads BP2 and through the plurality of string selection lines SSL, the plurality of word lines WL1 to WL4, and the plurality of ground selection lines GSL of the upper chip C2. The lower circuit may further include an I/O circuit 130 including a plurality of bit line selection transistors BLSLT. The plurality of bit line selection transistors BLSLT of the I/O circuit 130 may be connected to a plurality of channel structures CH0 of the memory cell array 110 through the plurality of lower bonding pads BP1 and the plurality of upper bonding pads BP2 and through the plurality of bit lines BL of the upper chip C2.

Transistors included in a peripheral circuit, for example, the program common source line transistor PGMTR, the plurality of erase common source line transistors ERSTR, the plurality of pass transistors PTR, and the plurality of bit line selection transistors BLSLT may be planar-type transistors, fin-type transistors, gate-all-around-type transistors, multi-bridge-channel-type transistors, or a combination thereof.

The first interlayer insulating layer DL1 may be located on the substrate SB and the peripheral circuit. The first interlayer insulating layer DL1 may include, for example, an insulating material that includes silicon oxide, silicon nitride, a low-k material, or a combination thereof. The low-k material may be a material having a dielectric constant lower than that of silicon oxide. For example, the low-k material may include phosphosilicate glass (PSG), borophosphosilicate glass (BPSG), fluorosilicate glass (FSG), organosilicate glass (OSG), spin-on-glass (SOG), a spin-on-polymer, or a combination thereof. The first interlayer insulating layer DL1 may include a plurality of interlayer insulating layers, which are stacked.

The common source line CSL may be located in an upper portion of the upper chip C2. The common source line CSL may include a semiconductor material.

The memory cell array 110 may be located on a lower surface of the common source line CSL. The memory cell array 110 may include a plurality of gate layers G0a to G0f, a plurality of insulating layers D0a to D0g, and a plurality of channel structures CH0. The plurality of gate layers G0a to G0f may be stacked on the lower surface of the common source line CSL and spaced apart from each other by the plurality of insulating layers D0a to D0f. Also, a first gate layer G0a may be spaced apart from the lower surface of the common source line CSL by a first insulating layer D0g. That is, the plurality of gate layers G0a to G0f and the plurality of insulating layers D0a to D0g may be alternately stacked on the lower surface of the common source line CSL. The plurality of gate layers G0a to G0f may include a conductive material including, but not limited to, tungsten (W), copper (Cu), silver (Ag), gold (Au), aluminum (Al), or a combination thereof. In some embodiments, the plurality of gate layers G0a to G0f may further include a barrier material including, but not limited to, titanium (Ti), tantalum (Ta), titanium nitride (TiN), tantalum nitride (TaN), or a combination thereof to reduce or prevent the conductive material from being diffused into the plurality of insulating layers D0a to D0g. The plurality of insulating layers D0a to D0g may include an insulating material including, but not limited to, silicon oxide, silicon nitride, or a combination thereof.

Each of the gate layers G0a to G0f may further include a gate insulating layer (not shown). The gate insulating layer may include a blocking insulating layer, a tunnel insulating layer, and a charge storage layer located between the blocking insulating layer and the tunnel insulating layer. The blocking insulating layer may include a high-k material including, but not limited to. hafnium oxide, lanthanum oxide, zirconium oxide, tantalum oxide, or a combination thereof. The charge storage layer may include, for example, silicon nitride. The charge storage layer may be a trap type. For example, the charge storage layer may further include quantum dots or nanocrystals. Here, the quantum dots or the nanocrystals may include fine particles of a conductive material. The tunnel insulating layer may include, for example, silicon oxide.

Each of the channel structures CH0 of the memory cell array 110 may pass through the plurality of gate layers G0a to G0f and the plurality of insulating layers D0a to D0g and be in contact with the common source line CSL. Each of the channel structures CH0 of the memory cell array 110 may include a channel pattern CP0, a buried insulating pattern IP0, and a pad pattern PP0. The channel pattern CP0 may pass through the plurality of gate layers G0a to G0f and the plurality of insulating layers D0a to D0g and be in contact with the common source line CSL. The channel pattern CP0 may include a semiconductor material. In some embodiments, the channel pattern CP0 may have a cup shape (or a hollow cylindrical shape with a blocked bottom. That is, the channel pattern CP0 may extend along a side surface of the channel structure CH0 and an upper surface of the channel structure CH0 that is in contact with the common source line CSL. A hollow defined by the channel pattern CP0 may be filled with the buried insulating pattern IP0. The buried insulating pattern IP0 may include, for example, an insulating material including, but not limited to, silicon oxide, silicon nitride, or a combination thereof. Unlike shown in FIG. 7A, in some embodiments, the channel pattern CP0 may have a cylindrical or circular pillar shape, and the buried insulating pattern IP0 may be omitted. The pad pattern PP0 may be located on a lower surface of the channel structure CH0. The pad pattern PP0 may include a semiconductor material.

Referring to FIGS. 2 and 7A, a plurality of gate layers G0a to G0f and one channel structure CH0 of a memory cell array 110 may constitute one of the NAND strings NS11 to NS33 shown in FIG. 2. For example, a first gate layer G0f may correspond to a gate electrode of a ground selection transistor GST, and second to fifth gate layers G0e to G0b may correspond to gate electrodes of first to fourth memory cells MC1 to MC4, and a sixth gate layer G0a may correspond to a gate electrode of a string selection transistor SST. Although FIG. 7A illustrates a case in which the memory cell array 110 includes six gate layers G0a to G0f and seven insulating layers D0a to D0g, the numbers of gate layers G0a to G0f and insulating layers D0a to D0g included in the memory cell array 110 may be varied according to the numbers of ground selection transistors GST, memory cells MC1 to MC8, and string selection transistors SST included in each of the NAND strings NS11 to NS33.

A plurality of string selection lines SSL, a plurality of word lines WL1 to WL4, and a plurality of ground selection lines GSL may be connected to the plurality of gate layers G0a to G0f of the memory cell array 110. For example, the plurality of ground selection lines GSL may be connected to the first gate layer G0f of the memory cell array 110, the plurality of word lines WL1 to WL4 may be connected to the second to fifth gate layers G0e to G0b, and the plurality of string selection lines SSL may be connected to the sixth gate layer G0a. A plurality of bit lines BL may be connected to a plurality of channel structures CH0 of the memory cell array 110. The plurality of string selection lines SSL, the plurality of word lines WL1 to WL4, and the plurality of ground selection lines GSL may be connected to a peripheral circuit of a lower chip C1, for example, a plurality of pass transistors PTR of a row decoder 120, through a plurality of upper bonding pads BP2 and a plurality of lower bonding pads BP1. The plurality of bit lines BL may be connected to the peripheral circuit of the lower chip C1, for example, a plurality of bit line selection transistors BLSLT of an I/O circuit 130, through the plurality of upper bonding pads BP2 and the plurality of lower bonding pads BP1.

The plurality of string selection lines SSL, the plurality of word lines WL1 to WL4, the plurality of ground selection lines GSL, and the plurality of bit lines BL may include a conductive material including, but not limited to, tungsten (W), copper (Cu), silver (Ag), gold (Au), aluminum (Al), or a combination thereof. In some embodiments, the plurality of string selection lines SSL, the plurality of word lines WL1 to WL4, the plurality of ground selection lines GSL, and the plurality of bit lines BL may further include a barrier material including, but not limited to, titanium (Ti), tantalum (Ta), titanium nitride (TiN), tantalum nitride (TaN), or a combination thereof to reduce or prevent the conductive material from being diffused into the second interlayer insulating layer DL2.

The plurality of read common source line transistors RDTR may be located on a lower surface of the common source line CSL. In some embodiments, each of the read common source line transistors RDTR may have a vertical transistor structure to facilitate the manufacture of each of the read common source line transistors RDTR together with the memory cell array 110. In other embodiments, the read common source line transistors RDTR may be respectively planar-type transistors, fin-type transistors, gate-all-around-type transistors, multi-bridge-channel-type transistors, or a combination thereof.

For example, each of the read common source line transistors RDTR may include a first insulating layer D1g, a gate layer G1, and a second insulating layer D1f, which are sequentially stacked on the lower surface of the common source line CSL, and/or a channel structure CH1, which passes through the gate layer G1 and is in contact with the common source line CSL. In some embodiments, the plurality of read common source line transistors RDTR may share the first insulating layer D1g, the gate layer G1, and the second insulating layer D1f. In some embodiments, similar to each of the channel structures CH0 of the memory cell array 100, the channel structure CH1 of each of the read common source line transistors RDTR may include a channel pattern, a buried insulating pattern, and a pad pattern.

In some embodiments, to reduce manufacturing costs and simplify manufacturing processes, the first insulating layer D1g, the gate layer G1, and the second insulating layer D1f of the read common source line transistors RDTR may be respectively formed simultaneously with the first insulating layer D0g, the first gate layer G0f, and the second insulating layer D0f of the memory cell array 110. Accordingly, the first insulating layer D1g, the gate layer G1, and the second insulating layer D1f of the read common source line transistor RDTR may respectively have the same or substantially the same chemical compositions and thicknesses as the first insulating layer D0g, the first gate layer G0f, and the second insulating layer D0f of the memory cell array 110. It will be understood herein that when two layers are referred to as having the same or substantially the same chemical composition and thickness, differences in chemical compositions and thicknesses of the two layers may be within ranges of variations of chemical compositions and thicknesses between two layers, which are simultaneously manufactured in one apparatus using a typical layer forming method (e.g., a sputtering process, a chemical vapor deposition (CVD) process, an atomic layer deposition (ALD) process, and an evaporation process), and the variations of the chemical composition and the thicknesses between the two layers may occur due to process restrictions. For example, when two layers are referred to as having the same or substantially the same chemical composition and thickness, differences in chemical compositions and thicknesses of the two layers may be about 10% or less, for example, within about 5% or less, and, for example, about 1% or less.

The gate layers G1 of the plurality of read common source line transistors RDTR may be connected to the peripheral circuit of the lower chip C1, for example, the control logic 150 through the upper bonding pad BP2 and the lower bonding pad BP1. A plurality of channel structures CH1 of the plurality of read common source line transistors RDTR may be connected to the ground pad GP. The ground pad GP may be exposed on an upper surface of the upper chip C2. The ground pad GP may include a conductive material, such as copper (Cu), aluminum (Al), gold (Au), silver (Ag), tungsten (W), or a combination thereof, but is not limited thereto.

The second interlayer insulating layer DL2 may be located on the lower surface of the common source line CSL and on the memory cell array 110 and the plurality of read common source line transistors RDTR. The plurality of string selection lines SSL, the plurality of word lines WL1 to WL4, and the plurality of ground selection lines GSL may be located in the second interlayer insulating layer DL2. The second interlayer insulating layer DL2 may be in contact with the first interlayer insulating layer DL1 of the lower chip C1. The second interlayer insulating layer DL2 may include, for example, an insulating material including silicon oxide, silicon nitride, a low-k material, or a combination thereof. The second interlayer insulating layer DL2 may include a plurality of interlayer insulating layers that are stacked.

The third interlayer insulating layer DL3 may be located on an upper surface of the common source line CSL. The third interlayer insulating layer DL3 may include an organic insulating material, an inorganic insulating material, or a combination thereof. The inorganic insulating material may include, for example, silicon oxide, silicon nitride, or a combination thereof.

According to an embodiment, the memory cell array 110 may be located in the upper chip C2, the plurality of read common source line transistors RDTR of the CSL driver 140 may be located in the upper chip C2, the plurality of program common source line transistors PGMTR and the plurality of erase common source line transistors ERSTR of the CSL driver 140 may be located in the lower chip C1, and the control logic 150, the row decoder 120, and the I/O circuit 130 may be located in the lower chip C1.

Since both the plurality of read common source line transistors RDTR of the CSL driver 140 and the memory cell array 110 are located in the upper chip C2, the common source line CSL connected to the memory cell array 110 may be connected to the plurality of read common source line transistors RDTR of the CSL driver 140 without passing through the upper bonding pad BP2 of the upper chip C2 and the lower bonding pad BP1 of the lower chip C1. Accordingly, an increase in resistance of an electrical path between the common source line CSL and the plurality of read common source line transistors RDTR of the CSL driver 140 due to a misalignment and a contact failure between the upper bonding pad PB2 of the upper chip C2 and the lower bonding pad BP1 of the lower chip C1 may be reduced or prevented. As a result, the occurrence of noise due to a voltage drop caused by the resistance of the electrical path between the common source line CSL and the plurality of read common source line transistors RDTR of the CSL driver 140 may be reduced.

Current flowing through the common source line CSL may be larger than current flowing through each of the string selection lines SSL, current flowing through each of the word lines WL, current flowing through each of the ground selection lines GSL, and current flowing through each of the bit lines BL, and thus, an electrical path between the memory cell array 110 and the CSL driver 140 may be more susceptible to noise caused by a resistance than an electrical path between the memory cell array 110 and the row decoder 120 and an electrical path between the memory cell array 110 and the I/O circuit 130. Accordingly, even if the row decoder 120 and the I/O circuit 130 are arranged in the lower chip C1, at least a portion of the CSL driver 140 may be arranged in the upper chip C2 together with the memory cell array 110 so that a resistance of an electrical path through which a relatively large current flows may be reduced to reduce noise caused by a voltage drop.

Furthermore, current flowing between the common source line CSL and the ground pad GP during a read operation may be larger than current flowing between the common source line CSL and the first voltage generator 141 during a program operation and current flowing between the common source line CSL and the second voltage generator 142 during an erase operation. Thus, the electrical path between the common source line CSL and the plurality of read common source line transistors RDTR may be more susceptible to noise caused by a voltage drop than an electrical path between the common source line CSL and the plurality of program common source line transistors PGMTR and an electrical path between the common source line CSL and the plurality of erase common source line transistors ERSTR. Therefore, even if the plurality of program common source line transistors PGMTR and the plurality of erase common source line transistors ERSTR are arranged in the lower chip C1, the plurality of read common source line transistors RDTR may be arranged in the upper chip C2 together with the memory cell array 110 so that a resistance of an electrical path through which a relatively large current flows may be reduced to reduce noise caused by a voltage drop.

Figure 7B:
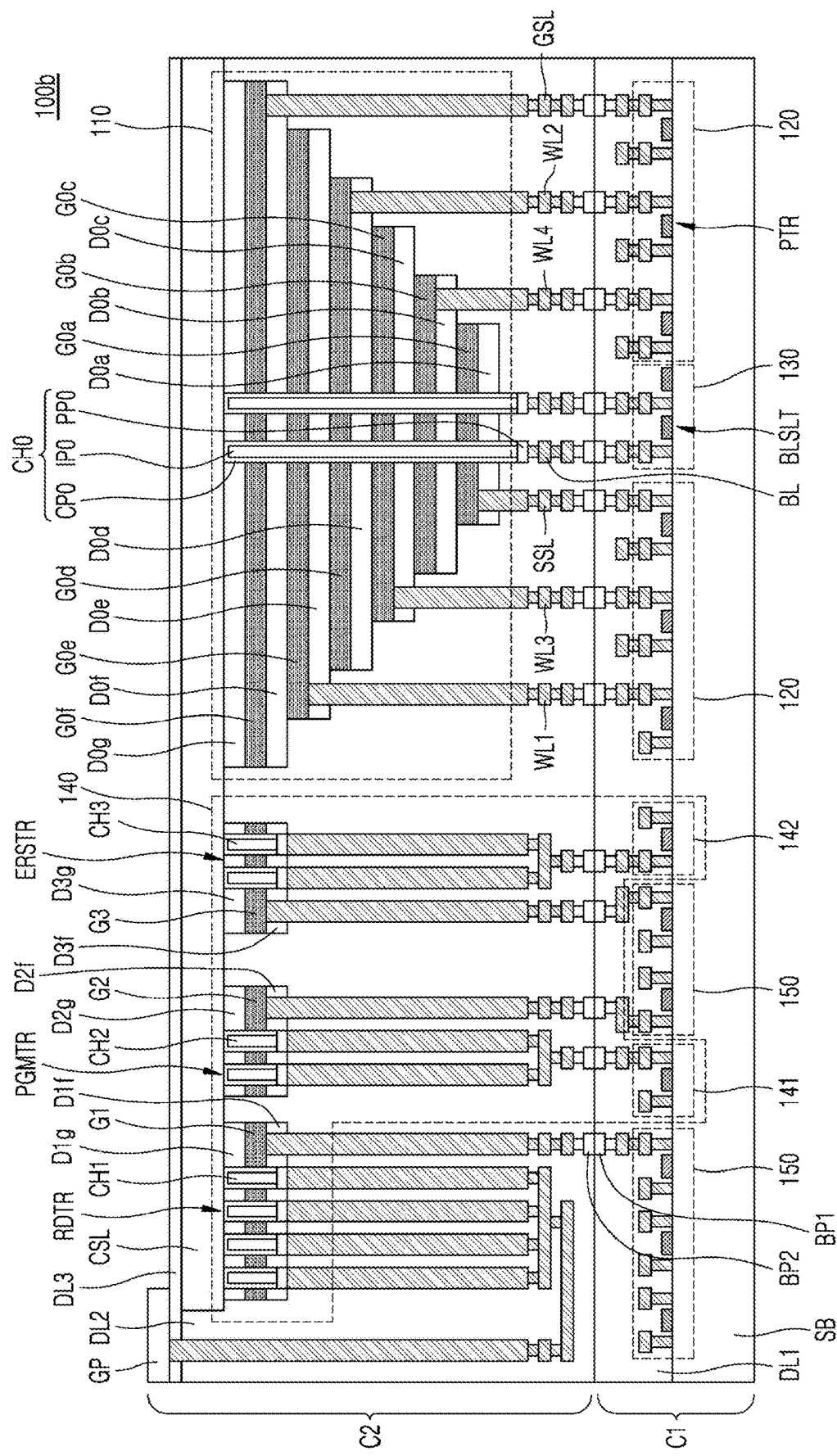
FIG. 7B is a cross-sectional view of a memory device according to an embodiment.

FIG. 7B is a cross-sectional view of a memory device 100b according to an embodiment.

Referring to FIG. 7B, unlike in the embodiment shown in FIG. 7A, a plurality of program common source line transistors PGMTR and/or a plurality of erase common source line transistors ERSTR may also be located in an upper chip C2. According to the present embodiment, the plurality of program common source line transistors PGMTR and/or the plurality of erase common source line transistors ERSTR may be arranged in the upper chip C2, and thus, a planar area of a lower chip C1 may be reduced. In contrast, since a first voltage generator 141 and/or a second voltage generator 142 have relatively complicated structures, the first voltage generator 141 and/or the second voltage generator 142 may be difficult to manufacture to be compatible with the memory cell array 110 or may occupy excessively large planar areas. Accordingly, the first voltage generator 141 and/or the second voltage generator 142 may be arranged in the lower chip C1.

The plurality of program common source line transistors PGMTR and the plurality of erase common source line transistors ERSTR may be located on a lower surface of the common source line CSL. In some embodiments, each of the program common source line transistor PGMTR and the erase common source line transistor ERSTR may have a vertical transistor structure to facilitate the manufacture of the program common source line transistor PGMTR and the erase common source line transistor ERSTR together with the memory cell array 110. In other embodiments, the program common source line transistor PGMTR and the erase common source line transistor ERSTR may be respectively planar-type transistors, fin-type transistors, gate-all-around-type transistors, multi-bridge-channel-type transistors, or a combination thereof.

For example, the plurality of program common source line transistors PGMTR may include a first insulating layer D2g, a gate layer G2, and a second insulating layer D2f, which are sequentially stacked on the lower surface of the common source line CSL, and a plurality of channel structures CH2, which pass through the first insulating layer D2g, the gate layer G2, and the second insulating layer D2f and are in contact with the common source line CSL. Similarly, each of the plurality of erase common source line transistors ERSTR may include a first insulating layer D3g, a gate layer G3, and a third insulating layer D3f, which are sequentially stacked on the lower surface of the common source line CSL, and a plurality of channel structures CH3, which pass through the first insulating layer D3g, the gate layer G3, and the third insulating layer D3f and are in contact with the common source line CSL.

In some embodiments, similar to each of the channel structures CH0 of the memory cell array 110, the channel structure CH2 of each of the program common source line transistors PGMTR and the channel structure CH3 of each of the erase common source line transistors ERSTR may include a channel pattern, a buried insulating pattern, and a pad pattern. The number of read common source line transistors RDTR included in a CSL driver 140 may be greater than the number of program common source line transistors PGMTR included in the CSL driver 140 and the number of erase common source line transistors ERSTR included in the CSL driver 140. Thus, the number of channel structures CH1 included in a plurality of read common source line transistors RDTR included in the CSL driver 140 may be greater than the number of channel structures CH2 included in the plurality of program common source line transistors PGMTR included in the CSL driver 140 and the number of channel structures CH3 included in a plurality of erase common source line transistors ERSTR included in the CSL driver 140.

In some embodiments, to reduce manufacturing costs and simplify manufacturing processes, the first insulating layer D2g, the gate layer G2, and the second insulating layer D2f of the program common source line transistor PGMTR may be respectively formed simultaneously with the first insulating layer D0g, the first gate layer G0f, and the second insulating layer D0f of the memory cell array 110. Similarly, the first insulating layer D3g, the gate layer G3, and the second insulating layer D3f of the erase common source line transistor ERSTR may be respectively formed simultaneously with the first insulating layer D0g, the first gate layer G0f, and the second insulating layer D0f of the memory cell array 110.

Accordingly, the first insulating layer D2g, the gate layer G2, and the second insulating layer D2f of the program common source line transistor PGMTR may respectively have the same or substantially the same chemical compositions and thicknesses as the first insulating layer D0g, the first gate layer G0f, and the second insulating layer D0f of the memory cell array 110. Similarly, the first insulating layer D3g, the gate layer G3, and the second insulating layer D3f of the erase common source line transistor ERSTR may respectively have the same or substantially the same chemical compositions and thicknesses as the first insulating layer D0g, the first gate layer G0f, and the second insulating layer D0f of the memory cell array 110.

The gate layer G2 of each of the plurality of program common source line transistors PGMTR and the gate layer G3 of each of the plurality of erase common source line transistors ERSTR may be connected to a peripheral circuit (e.g., a control logic 150) of the lower chip C1 through an upper bonding pad BP2 and a lower bonding pad BP1. The plurality of channel structures CH2 of the plurality of program common source line transistors PGMTR may be connected to a peripheral circuit (e.g., the first voltage generator 141) of the lower chip C1 through the upper bonding pads BP2 and the lower bonding pads BP1. The plurality of channel structures CH3 of the plurality of erase common source line transistors ERSTR may be connected to a peripheral circuit (e.g., the second voltage generator 142) of the lower chip C1 through the upper bonding pads BP2 and the lower bonding pads BP1.

Figure 7C:
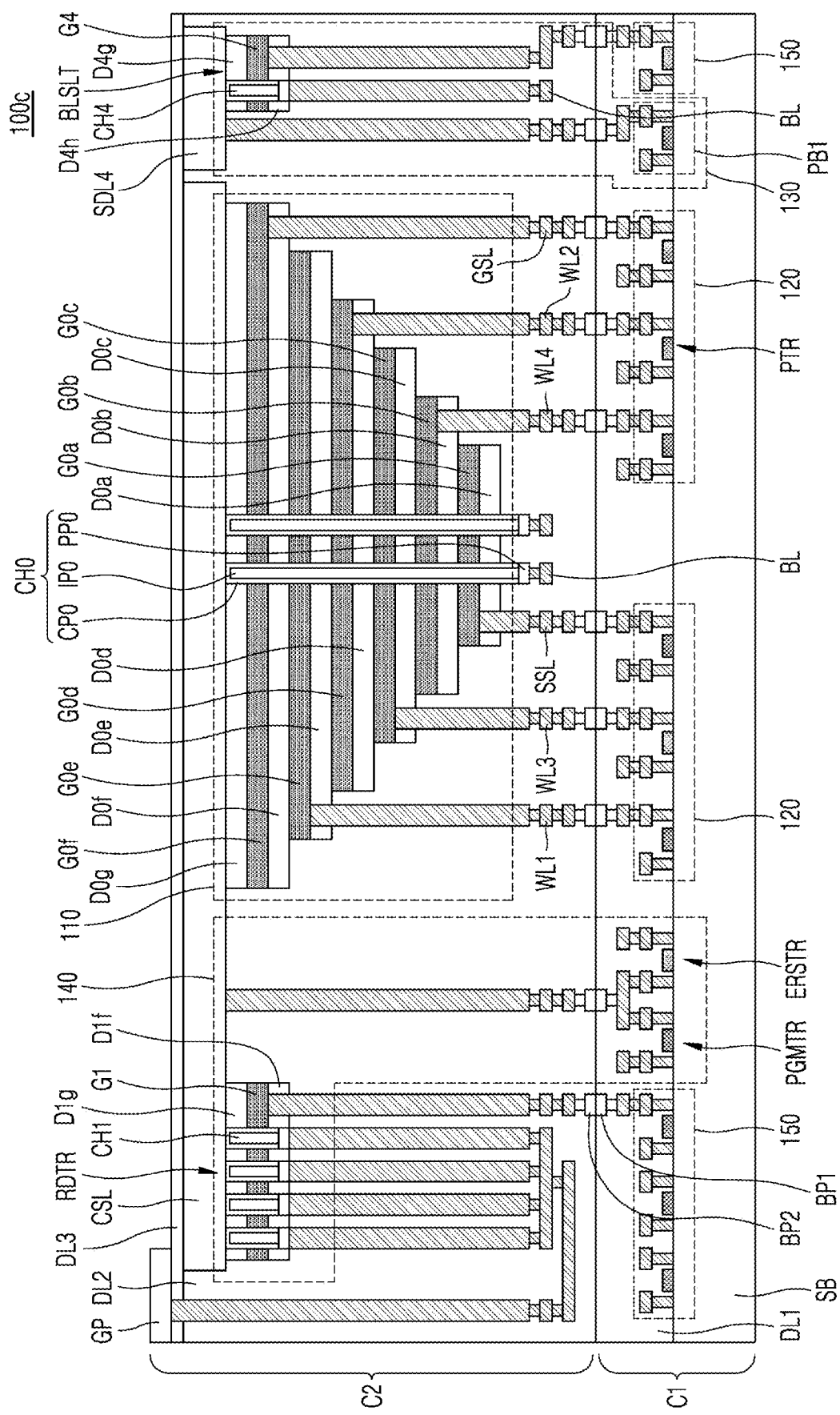
FIG. 7C is a cross-sectional view of a memory device according to an embodiment.

FIG. 7C is a cross-sectional view of a memory device 100c according to an embodiment.

Referring to FIG. 7C, unlike in the embodiment shown in FIG. 7A, at least a portion of an I/O circuit 130 may be located in an upper chip C2. According to the present embodiment, a planar area of a lower chip C1 may be reduced. In an embodiment, a plurality of bit line selection transistors BSLT of the I/O circuit 130 may be arranged in the upper chip C2 to reduce the planar area of the lower chip C1. However, since each page buffer PB1 has a relatively complicated structure, the page buffer PB1 may be difficult to manufacture to be compatible with a memory cell array 110 or may occupy an excessively large planar area. Thus, the page buffer PB1 may be arranged in the lower chip C1.

In some embodiments, a plurality of bit line selection transistors BSLT may have a vertical transistor structure to facilitate the manufacture of the plurality of bit line selection transistors BSLT together with the memory cell array 110. In other embodiments, the plurality of bit line selection transistors BSLT may be planar-type transistors, fin-type transistors, gate-all-around-type transistors, multi-bridge-channel-type transistors, or a combination thereof.

For example, each of the bit line selection transistors BSLT may include a first insulating layer D4g, a gate layer G4, and a second insulating layer D4f, which are sequentially stacked on a lower surface of a source/drain layer SDL4, and include a channel structure CH4, which passes through the first insulating layer D4g, the gate layer G4, and the second insulating layer D4f and is in contact with the source/drain layer SDL4. The source/drain layer SDL4 may include a semiconductor material. In some embodiments, similar to the channel structure CH0 of the memory cell array 110, the channel structure CH4 of each of the bit line selection transistors BSLT may include a channel pattern, a buried insulating pattern, and a pad pattern.

A plurality of source/drain layers SDL4 may be located on a lower surface of a third interlayer insulating layer DL3 and separated from a common source line CSL and from each other. In some embodiments, to reduce manufacturing costs and simplify manufacturing processes, the source/drain layer SDL4 may be formed simultaneously with the common source line CSL. Accordingly, the source/drain layer SDL4 may have the same or substantially the same chemical composition and thickness as the common source line CSL. Also, the first insulating layer D4g, the gate layer G4, and the second insulating layer D4f of each of the bit line selection transistors BSLT may be respectively formed simultaneously with the first insulating layer D0g, the first gate layer G0f, and the second insulating layer D0f of the memory cell array 110. Accordingly, the first insulating layer D4g, the gate layer G4, and the second insulating layer D4f of the bit line selection transistor BSLT may respectively have the same or substantially the same chemical compositions and thicknesses as the first insulating layer D0g, the first gate layer G0f, and the second insulating layer D0f of the memory cell array 110.

The gate layer G4 of each of the bit line selection transistors BSLT may be connected to the peripheral circuit of the lower chip C1, for example, the control logic 150, through the upper bonding pad BP2 and the lower bonding pad BP1. The channel structure CH4 of each of the bit line selection transistors BLSLT may be connected to the peripheral circuit of the lower chip C1, for example, a plurality of page buffers PB1, through the upper bonding pads BP2 and the lower bonding pads BP1. FIG. 7C illustrates a case in which bit lines BL are respectively connected to lower ends of channel structures CH4 and the page buffers PB1 are respectively connected to upper ends of the channel structures CH4 through the source/drain layers SDL4. However, in other embodiments, the page buffers PB1 may be respectively connected to the lower ends of the channel structures CH4, and the bit lines BL may be respectively connected to the upper ends of the channel structures CH4 through the source/drain layers SDL4.

Figure 7D:
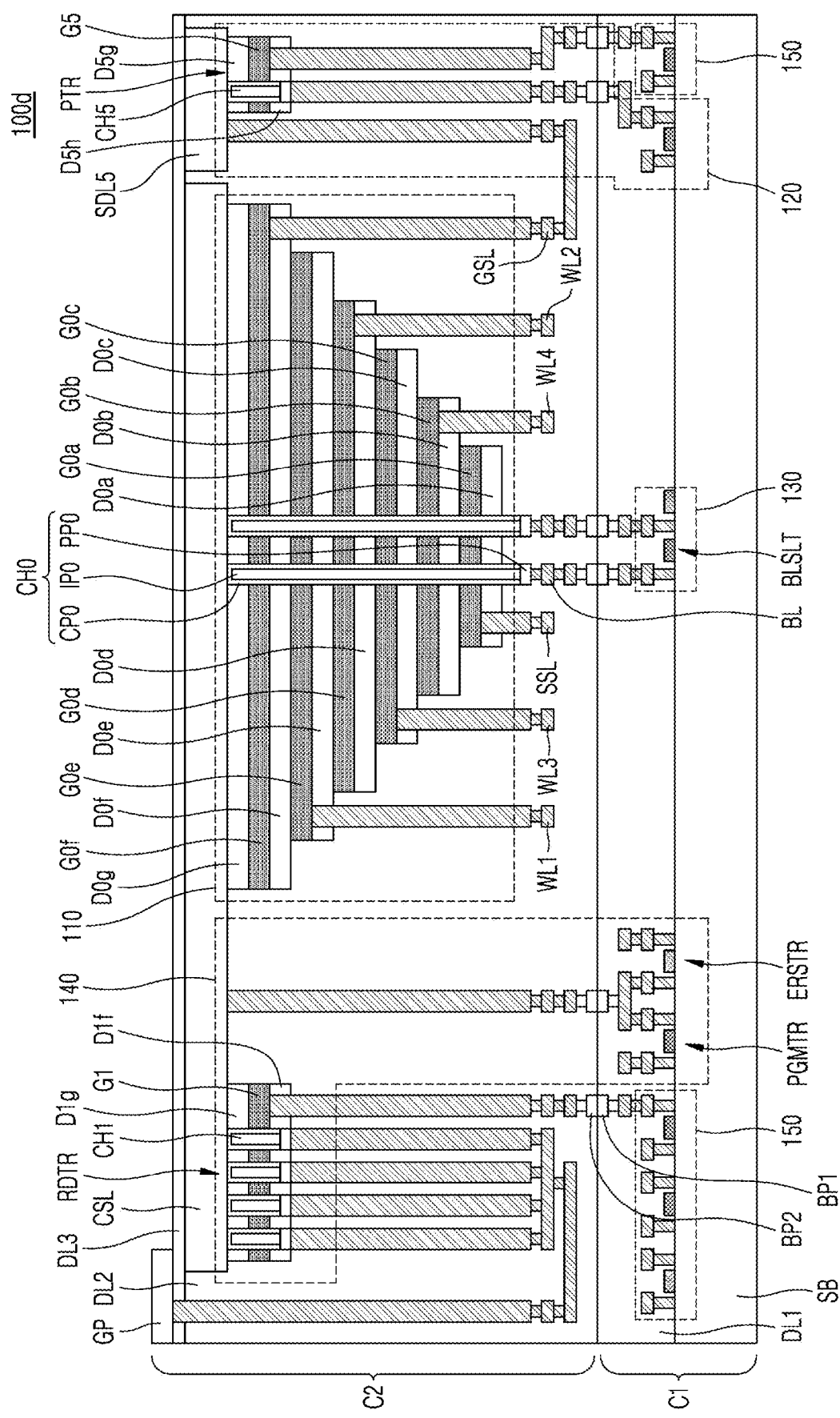
FIG. 7D is a cross-sectional view of a memory device according to an embodiment.

FIG. 7D is a cross-sectional view of a memory device 100d according to an embodiment.

Referring to FIG. 7D, unlike in the embodiment shown in FIG. 7A, a portion of the row decoder 120 may be located in the upper chip C2. According to the present embodiment, a planar area of a lower chip C1 may be reduced. In an embodiment, a plurality of pass transistors PTR of the row decoder 120 may be arranged in the upper chip C2 to reduce the planar area of the lower chip C1. In contrast, since the remaining portion of the row decoder 120 has a relatively complicated structure, the remaining portion of the row decoder 120 may be difficult to manufacture to be compatible with the memory cell array 110 or may occupy an excessively large planar area. Thus, the remaining portion of the row decoder 120 may be arranged in the lower chip C1.

In some embodiments, each of the pass transistors PTR may have a vertical transistor structure to facilitate the manufacture of each of the pass transistors PTR together with the memory cell array 110. In other embodiments, the plurality of pass transistors PTR may be planar-type transistors, fin-type transistors, gate-all-around-type transistors, multi-bridge-channel-type transistors, or a combination thereof.

For example, each of the pass transistors PTR may include a first insulating layer D5g, a gate layer G5, and a second insulating layer D5f, which are sequentially stacked on a lower surface of a source/drain layer SDL5, and include a channel structure CH5, which passes through the first insulating layer D5g, the gate layer G5, and the second insulating layer D5f and is in contact with the source/drain layer SDL5. In some embodiments, similar to each of the channel structures CH0 of the memory cell array 110, the channel structure CH5 of each of the pass transistors PTR may include a channel pattern, a buried insulating pattern, and a pad pattern.

The source/drain layer SDL5 may include a semiconductor material. A plurality of source/drain layers SDL5 may be located on a lower surface of a third interlayer insulating layer DL3 and separated from a common source line CSL and from each other. In some embodiments, the plurality of source/drain layers SDL5 may be formed simultaneously with the common source line CSL to reduce manufacturing costs and simplify manufacturing processes. Thus, each of the source/drain layers SDL5 may have the same or substantially the same chemical composition and thickness as the common source line CSL. Also, the first insulating layer D5g, the gate layer G5, and the second insulating layer D5f of the pass transistor PTR may be respectively formed simultaneously with a first insulating layer D0g, a first gate layer G0f, and a second insulating layer D0f of the memory cell array 110. Accordingly, the first insulating layer D5g, the gate layer G5, and the second insulating layer D5f of the pass transistor PTR may respectively have the same or substantially the same chemical compositions and thicknesses as the first insulating layer D0g, the first gate layer G0f, and the second insulating layer D0f of the memory cell array 110.

The gate layer G5 of each of the pass transistors PTR may be a peripheral circuit (e.g., a control logic 150) of the lower chip C1 through an upper bonding pad BP2 and a lower bonding pad BP1. The channel structure CH5 of each of the pass transistors PTR may be connected to the peripheral circuit of the lower chip C1 through the upper bonding pad BP2 and the lower bonding pad BP1. FIG. 7D illustrates a case in which one of a plurality of ground selection lines GSL, word lines WL1 to WL4, and a plurality of string selection lines SSL is connected to an upper end of the channel structure CH5 of the pass transistor PTR through the source/drain layer SDL5, and the remaining portion of the row decoder 120 is connected a lower end of the channel structure CH5 of the pass transistor PTR. However, in other embodiments, one of the plurality of ground selection lines GSL, the word lines WL1 to WL4, and the plurality of string selection lines SSL is connected to the lower end of the channel structure CH5 of the pass transistor PTR, and the remaining portion of the row decoder 120 may be connected to the upper end of the channel structure CH5 of the pass transistor PRT through the source/drain layer SDL5.

Figure 8:
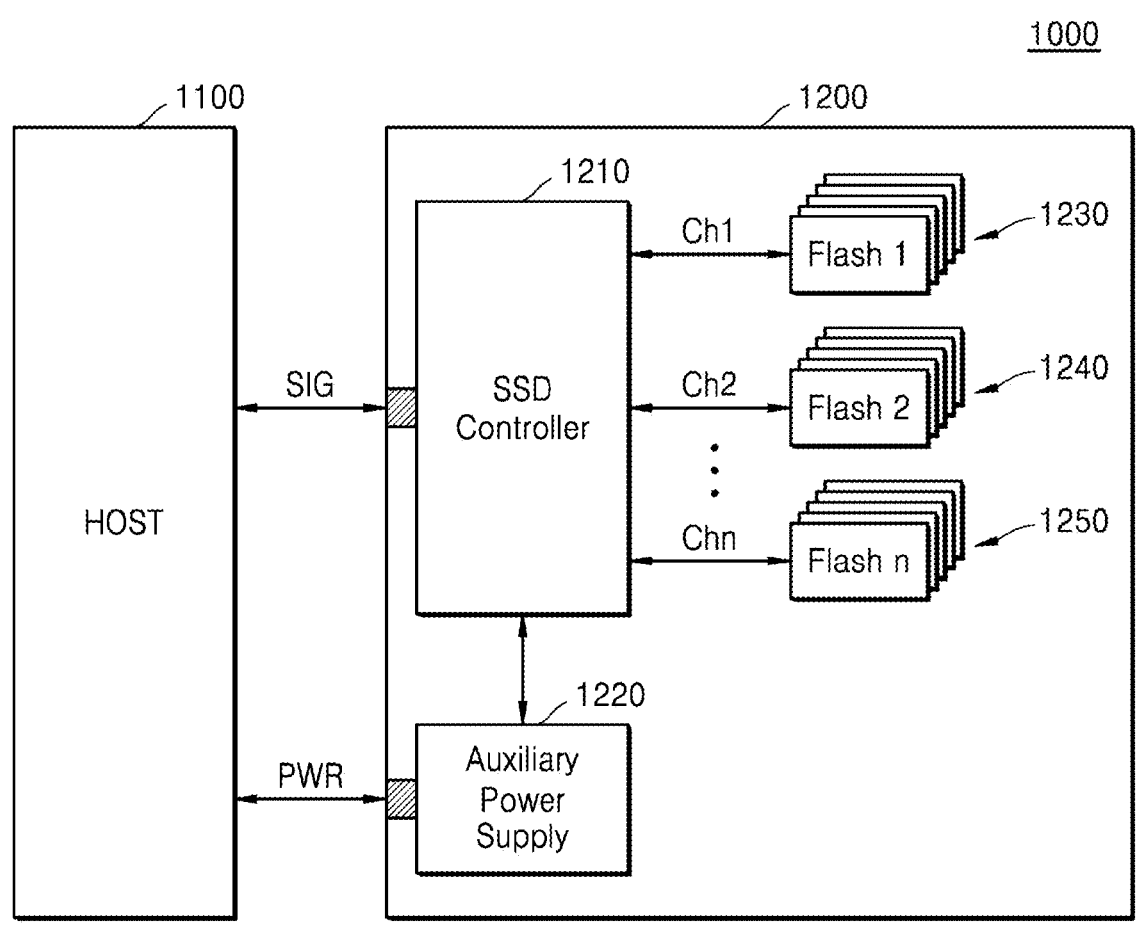
FIG. 8 is a block diagram of a solid-state drive (SSD) system including a memory device according to an embodiment.

FIG. 8 is a block diagram of a solid-state drive (SSD) system 1000 including a memory device according to an embodiment.

Referring to FIG. 8, the SSD system 1000 may include a host 1100 and an SSD 1200. The SSD 1200 may transmit and receive signals to and from a host 1100 through a signal connector and receive power through a power connector.

The SSD 1200 may include an SSD controller 1210, an auxiliary power supply device 1220, and/or a plurality of memory devices (e.g., memory devices 1230, 1240, and 1250). Each of the plurality of memory devices 1230, 1240, and 1250 may be implemented according to the embodiments described above with reference to FIGS. 7A and 7D.

While the inventive concepts have been particularly shown and described with reference to embodiments thereof, it will be understood that various changes in form and details may be made therein without departing from the spirit and scope of the following claims.

What is claimed is:

1. A memory device comprising:
   a memory cell array;
   a row decoder connected to the memory cell array by a plurality of string selection lines, a plurality of word lines, and a plurality of ground selection lines; and
   a common source line driver connected to the memory cell array by a common source line,
   wherein the memory cell array is in an upper chip,
   at least a portion of the row decoder is in a lower chip,
   at least a portion of the common source line driver is in the upper chip, and
   a plurality of upper bonding pads of the upper chip are connected to a plurality of lower bonding pads of the lower chip to connect the upper chip to the lower chip.

2. The memory device of claim 1, wherein
   the common source line driver comprises a read common source line transistor configured to selectively ground the common source line,
   wherein the read common source line transistor is in the upper chip.

3. The memory device of claim 2, wherein
   the common source line driver further comprises a program common source line transistor configured to selectively apply a voltage to the common source line, wherein the program common source line transistor is in the upper chip.

4. The memory device of claim 2, wherein
the common source line driver further comprises an erase common source line transistor configured to selectively apply a voltage to the common source line,
wherein the erase common source line transistor is in the upper chip.

5. The memory device of claim 1, further comprising
an input/output (I/O) circuit connected to the memory cell array by a plurality of bit lines,
wherein at least a portion of the I/O circuit is in the upper chip.

6. The memory device of claim 5, wherein
the I/O circuit comprises a plurality of page buffers and a plurality of bit line selection transistors configured to selectively connect the plurality of page buffers to the plurality of bit lines,
wherein the plurality of bit line selection transistors are in the upper chip.

7. The memory device of claim 1, wherein
the common source line driver comprises a plurality of read common source line transistors configured to selectively ground the common source line and a plurality of program common source line transistors configured to selectively apply a voltage to the common source line,
a number of read common source line transistors is greater than a number of program common source line transistors, and
the plurality of read common source line transistors are in the upper chip.

8. The memory device of claim 1, wherein
current flowing through the common source line is larger than current flowing through each the plurality of string selection lines, current flowing through each of the plurality of word lines, and current flowing through each of the plurality of ground selection lines.

9. A memory device comprising
a lower chip and an upper chip,
wherein the upper chip comprises a common source line, a memory cell array on the common source line, a read common source line transistor on the common source line, a ground pad connected to the read common source line transistor, and a plurality of upper bonding pads connected to the memory cell array,
the lower chip comprises a substrate, a lower circuit on the substrate, and a plurality of lower bonding pads connected to the lower circuit, and
the upper chip is in contact with the lower chip such that the plurality of upper bonding pads of the upper chip are in contact with the plurality of lower bonding pads of the lower chip.

10. The memory device of claim 9, wherein
the ground pad is connected to the read common source line transistor without passing through the plurality of upper bonding pads and the plurality of lower bonding pads.

11. The memory device of claim 9, wherein
the read common source line transistor comprises a gate layer on the common source line and a channel structure configured to pass through the gate layer and be in contact with the common source line.

12. The memory device of claim 9, wherein
a gate of the read common source line transistor is connected to the lower circuit.

13. The memory device of claim 9, further comprising
a program common source line transistor on the common source line,
wherein the program common source line transistor is connected to a voltage generator.

14. The memory device of claim 13, wherein
the lower circuit comprises the voltage generator.

15. A memory device comprising:
a common source line in an upper portion of an upper chip;
a memory cell array comprising a plurality of gate layers and a plurality of channel structures, the plurality of gate layers stacked on a lower surface of the common source line and spaced apart from each other, the plurality of channel structures passing through the plurality of gate layers and in contact with the common source line;
a read common source line transistor comprising a gate layer and a channel structure, the gate layer on the lower surface of the common source line, the channel structure passing through the gate layer and in contact with the common source line;
a ground pad connected to the channel structure of the read common source line transistor and in the upper portion of the upper chip;
a plurality of upper bonding pads connected to the memory cell array and in a lower portion of the upper chip;
a substrate in a lower portion of a lower chip;
a lower circuit on an upper surface of the substrate; and
a plurality of lower bonding pads connected to the lower circuit and in an upper portion of the lower chip, the plurality of lower bonding pads being in contact with the plurality of upper bonding pads of the upper chip.

16. The memory device of claim 15, wherein
a thickness of the gate layer of the read common source line transistor is substantially equal to a thickness of an uppermost gate layer of the plurality of gate layers of the memory cell array.

17. The memory device of claim 15, wherein
a chemical composition of the gate layer of the read common source line transistor is substantially same as a chemical composition of an uppermost gate layer of the plurality of gate layers of the memory cell array.

18. The memory device of claim 15, wherein
the read common source line transistor comprises a plurality of read common source line transistors, which comprise a gate layer on the lower surface of the common source line and a plurality of channel structures passing through the gate layer and in contact with the common source line.

19. The memory device of claim 18, further comprising
a plurality of program common source line transistors comprising a gate layer and a plurality of channel structures, the gate layer on the lower surface of the common source line, the plurality of channel structures passing through the gate layer and in contact with the common source line,
wherein a number of the plurality of channel structures of the plurality of read common source line transistors is greater than a number of channel structures of the plurality of program common source line transistors.

20. The memory device of claim 19, wherein
the lower circuit comprises a plurality of program common source line transistors connected to the common source line and a voltage generator connected to the plurality of program common source line transistors.

* * * * *